United States Patent
Shi

(10) Patent No.: US 10,781,326 B2
(45) Date of Patent: Sep. 22, 2020

(54) INK-JET PRINTING INK OF AN ELECTRON TRANSPORT LAYER AND ITS MANUFACTURING METHOD

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Ting Shi, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 480 days.

(21) Appl. No.: 15/736,582

(22) PCT Filed: Nov. 29, 2017

(86) PCT No.: PCT/CN2017/113671
§ 371 (c)(1),
(2) Date: Dec. 14, 2017

(87) PCT Pub. No.: WO2019/075866
PCT Pub. Date: Apr. 25, 2019

(65) Prior Publication Data
US 2019/0382605 A1    Dec. 19, 2019

(30) Foreign Application Priority Data
Oct. 16, 2017  (CN) .......................... 2017 1 0960604

(51) Int. Cl.
| C09D 11/30 | (2014.01) |
| H01L 51/00 | (2006.01) |
| H01L 51/50 | (2006.01) |
| H01L 51/56 | (2006.01) |

(52) U.S. Cl.
CPC .......... *C09D 11/30* (2013.01); *H01L 51/0005* (2013.01); *H01L 51/0007* (2013.01); *H01L 51/5072* (2013.01); *H01L 51/5088* (2013.01); *H01L 51/56* (2013.01)

(58) Field of Classification Search
None
See application file for complete search history.

(56) References Cited

U.S. PATENT DOCUMENTS

| 8,076,842 | B2* | 12/2011 | Gong ............... H01L 51/0003 313/506 |
| 9,172,049 | B2* | 10/2015 | Jenekhe ............... C07D 215/12 |
| 2006/0235105 | A1* | 10/2006 | Gratson ............... C09D 11/03 523/160 |
| 2008/0015269 | A1* | 1/2008 | Bazan ............... H01L 51/0035 521/30 |
| 2012/0299045 | A1* | 11/2012 | Pan ............... H01L 51/5296 257/98 |
| 2013/0006118 | A1* | 1/2013 | Pan ............... H01L 51/5024 600/476 |
| 2014/0249606 | A1* | 9/2014 | Pan ............... H01L 51/0058 607/88 |
| 2016/0126505 | A1* | 5/2016 | Choi ............... H01L 51/5072 257/40 |
| 2018/0346748 | A1* | 12/2018 | Pan ............... C09D 11/037 |
| 2019/0229298 | A1* | 7/2019 | Shi ............... H01L 51/0004 |

FOREIGN PATENT DOCUMENTS

| CN | 1826393 | 8/2006 |
| CN | 102585171 | 7/2012 |
| CN | 107623076 | 1/2018 |
| WO | WO 2019/061753 A1 * | 4/2019 |

OTHER PUBLICATIONS

English translation of the International Search Report dated Jun. 27, 2018 for PCT/CN2017/113671; 2 pages.*
English translation of the Written Opinion of the International Search Authority dated Jun. 27, 2018 for PCT/CN2017/113671; 6 pages.*
English translation of CN 102585171, Jul. 2012; 16 pages.*
Hoven et al., "Recent Applications of Conjugated Polyelectrolytes in Optoelectronic Devices"; Adv. Matter, 2008, 20, pp. 3793-3810; 18 pages.*

* cited by examiner

*Primary Examiner* — Helene Klemanski
(74) *Attorney, Agent, or Firm* — Hemisphere Law, PLLC; Zhigang Ma

(57) ABSTRACT

An ink-jet printing ink of an electron transport layer and its preparing method are provided. The method of the disclosure adopts an ionic conjugated polyelectrolyte as a solute and alcohol compounds as a solvent. By adjusting the proportion of each component, viscosity and surface tension to obtain an ink-jet printing ink of the electron transport layer. The ink-jet printing ink meets the manufacturing requirements and is able to be produced by ink-jet printing process. Simultaneously, it avoids a mutually soluble phenomenon occurred between the electron transport layer and the adjacent structural layers during the preparation of the OLED, which is favorable for the production of a full-solution OLED device. According to the above method, the disclosure satisfies the manufacturing requirements of the ink-jet printing and realizes the ink-jet printing type of the electron transport layer, and is favorable for the production of a full-solution OLED device.

11 Claims, 1 Drawing Sheet

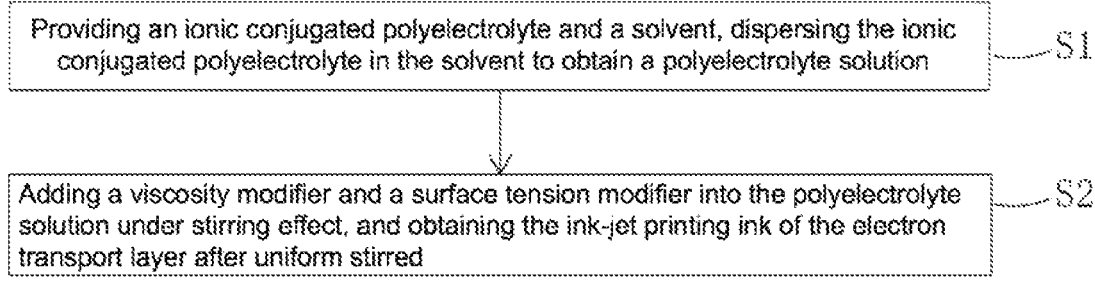

INK-JET PRINTING INK OF AN ELECTRON TRANSPORT LAYER AND ITS MANUFACTURING METHOD

FIELD OF THE DISCLOSURE

The disclosure relates to a display technical field, and more particularly to an ink-jet printing ink of an electron transport layer and its preparing method.

BACKGROUND

An organic Light Emitting Display (OLED) has many advantages, such as self-luminous, low driving voltage, high luminous efficiency, short response time, sharpness and contrast, nearly 180° viewing angle, wide temperature range, flexible and large-area panchromatic, which is recognized as the most promising display device.

OLEDs can be classified into a passive matrix OLEDs (PMOLEDs) and an active matrix OLEDs (AMOLEDs) according to driving modes, namely, a direct addressing and a thin film transistor matrix addressing. Wherein AMOLED has an array of pixels arranged, belonging to the active display type, which is high luminous efficiency, and usually used for high-definition large-size display.

The OLED usually includes a substrate, an anode provided on the substrate, a hole injection layer provided on the anode, a hole transport layer provided on the hole injection layer, a light emitting layer provided on the hole transport layer, an electron transport layer provided on the light emitting layer, and a cathode provided on the electron transport layer. The principle of light-emitting OLED display device is that semiconductor materials and organic light-emitting materials are driven under an electric field to achieve carriers injection and recombination for light. Specifically, the OLED display device generally adopts an ITO pixel electrode and a metal electrode respectively as the anode and the cathode of the device. Under a certain voltage, the electron and hole are injected from the cathode and the anode into the electron transport layer and the hole transport layer respectively. The electron and hole migrate to the light-emitting layer through the electron transport layer and the hole transport layer, respectively, and meet in the light-emitting layer to form excitons and excite a light-emitting molecule, which emits visible light through radiation relaxation.

Presently, the most common methods to prepare the OLED device are as follows: the hole injection layer, the hole transport layer and the light-emitting layer prepared by the ink-jet printing. The electron transport layer and the cathode are prepared by a vacuum thermal evaporation method. Due to the high cost of the vacuum thermal evaporation method, the production cost of the OLED device is relatively high, which limits the commercialization of the OLED device in a wide range. The ink-jet printing method uses a plurality of nozzles to drop the ink of the functional material into a predetermined pixel area, and then a desired film is obtained by drying. The method has the advantages of high material utilization and so on, as well as is a key technology for solving the problem of the display cost of a large-size OLED device. However, due to the mutually soluble phenomenon between adjacent printing ink layers, and the materials of the electron transporting layer and the cathode are mostly the evaporation materials, it is very difficult to realize a full-solution-process OLED device.

The conjugated cationic electrolytes are one kind of the materials of the soluble electron transport materials that have been demonstrated to have excellent electron transport properties in OLED and OPV (organic solar battery) devices that can significantly improve device performance. Therefore, dispersing an ionic conjugated polyelectrolyte in a solvent is to prepare the ink-jet printing ink of the electron transport layer, and preparing the electron transport layer by printing, pad printing, spin coating and so on, is conducive to the production of an all-solution OLED device. However, the ink-jet printing equipment and the printing process have certain requirements on the ink. In order to make the ink suitable for the ink-jet printing technology, it is usually necessary to comprehensively adjust the solvent components, a viscosity and a surface tension of the ink. Therefore, an ink-jet printing equipment and printing process conditions of ink-jet printing ink of the electron transport layer need to be improved.

SUMMARY

An objective of the disclosure is to provide a method of preparing an ink-jet printing ink of an electron transport layer, wherein the preparation process is simple and the prepared the ink-jet ink has a certain viscosity, a surface tension and a volatility, which can meet the manufacturing requirements of the ink-jet printing and realize the ink-jet printing type of the electron transport layer.

Another objective of the disclosure is to provide an ink-jet printing ink of an electron transport layer which can meet the ink-jet printing process requirements and achieve the ink-jet printing ink by the electron transport layer.

To realize the above objectives, the disclosure provides the method of preparing an ink-jet printing ink of an electron transport layer, comprising:

Step S1, providing an ionic conjugated polyelectrolyte and a solvent, dispersing the ionic conjugated polyelectrolyte in the solvent to obtain a polyelectrolyte solution.

Step S2, adding a viscosity modifier and a surface tension modifier into the polyelectrolyte solution under stirring effect, and obtaining the ink-jet printing ink of the electron transport layer after being stirred evenly.

The ionic conjugated polyelectrolyte is a cationic conjugated polyelectrolyte, the solvent comprises an alcohol compound or a mixture of a plurality of the alcohol compounds, the alcohol compound is a monohydric alcohol or a polyhydric alcohol.

The cationic conjugated polyelectrolyte is a carboxyl-substituted cationic conjugated polyelectrolyte, a metal cation in the cationic conjugated polyelectrolyte is a sodium ion; and the solvent comprises at least one high boiling alcohol compound with the boiling point greater than 200° C.

The surface tension modifier comprises one or more of a cosolvent, a surfactant, and a small molecule compound that regulates surface tension, a small molecular compound for regulating surface tension comprises one or more of an imidazole and its derivatives, a phenol and a hydroquinone, the viscosity modifier comprises one or more of an alcohol, an ether, an ester, a phenol, and an amine.

In the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; a mass percentage of the viscosity modifier is 0.1%~5%.

The viscosity of the ink-jet printing ink of the electron transport layer is 1 cps~10 cps, the surface tension of the ink-jet printing ink of the electron transport layer is 30 dyne/cm~40 dyne/cm.

The ink-jet printing ink of the electron transport layer comprises the solvent and the ionic conjugated polyelectrolyte dispersed in the solvent, the viscosity modifier and the surface tension modifier.

The ionic conjugated polyelectrolyte is the cationic conjugated polyelectrolyte, the solvent comprises the alcohol compound or the mixture of a plurality of the alcohol compounds, the alcohol compound is the monohydric alcohol or the polyhydric alcohol.

The cationic conjugated polyelectrolyte is the carboxyl-substituted cationic conjugated polyelectrolyte, the metal cation in the cationic conjugated polyelectrolyte is the sodium ion; and the solvent comprises at least one high boiling alcohol compound with the boiling point greater than 200° C.

The surface tension modifier comprises one or more of the cosolvent, the surfactant, and the small molecule compound that regulates surface tension, the small molecular compound for regulating surface tension comprises one or more of the imidazole and its derivatives, the phenol and the hydroquinone, the viscosity modifier includes one or more of the alcohol, the ether, the ester, the phenol, and the amine.

In the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; a mass percentage of the viscosity modifier is 0.1%~5%.

The viscosity of the ink-jet printing ink of the electron transport layer is 1 cps~10 cps, the surface tension of the ink-jet printing ink of the electron transport layer is 30 dyne/cm~40 dyne/cm.

The beneficial effects of the disclosures are as follows: the disclosure of the ink-jet printing of the electron transport layer adopts the ionic conjugated polyelectrolyte as the solute and the alcohol compounds as the solvent. By adjusting the proportion of each component, viscosity and surface tension to obtain an ink-jet printing technology, suitable for the ink-jet printing ink of the electron transport layer, meets the ink-jet printing process requirements and achieves the method of the ink-jet printing of the electron transport layer. Simultaneously, it avoids a mutually soluble phenomenon occurred between the electron transport layer and the adjacent structural layers during the preparation of the OLED, which is favorable for the production of a full-solution OLED device. According to the above method, the present invention satisfies the manufacturing requirements of the ink-jet printing and realizes the ink-jet printing type of the electron transport layer, which is favorable for the production of a full-solution OLED device.

In order to further understand the features and technical contents of the disclosure, please refer to the detailed description and the FIGURE related to the present invention. However, the FIGURE is only for references and descriptions, which is not intended to limit the disclosure.

BRIEF DESCRIPTION OF THE DRAWINGS

With reference to the FIGURE, through the detailed description of the specific embodiments of the disclosure, and the technical solutions and other beneficial effects of the disclosure will be obvious.

In the FIGURE,

FIG. 1 is a flow chart of the method for preparing ink-jet printing ink of an electron transport layer of the disclosure.

DETAILED DESCRIPTION OF PREFERRED EMBODIMENTS

To further illustrate the technical methods adopted by the disclosure and the effects, the following describes the preferred embodiments of the disclosure and the FIGURE in detail.

See FIG. 1, the disclosure provides the method of an ink-jet printing ink of an electron transport layer, comprising the following steps:

Step S1, providing an ionic conjugated polyelectrolyte and a solvent, dispersing the ionic conjugated polyelectrolyte in the solvent to obtain a polyelectrolyte solution.

Specifically, the ionic conjugated polyelectrolyte may be a cationic conjugated polyelectrolyte or an anionic conjugated polyelectrolyte, preferably the cationic conjugated polyelectrolyte.

Preferably, the cationic conjugated polyelectrolyte is a carboxyl-substituted cationic conjugated polyelectrolyte.

Preferably, the metal cation in the cationic conjugated polyelectrolyte is a sodium ion ($Na^+$).

Specifically, the solvent includes an alcohol compound or a mixture of a plurality of the alcohol compounds, the alcohol compound is a monohydric alcohol or a polyhydric alcohol. The solvent is used for dissolving the ionic conjugated polyelectrolyte and is simultaneously used for regulating the physical properties of the subsequently prepared ink-jet printing ink of the electron transporting layer to meet the requirements of ink-jet printing.

Specifically, the solvent contains at least one high-boiling alcohol compound having a boiling point greater than 200° C. The high-boiling alcohol compound is beneficial to improve the boiling point of the ink-jet printing ink obtained subsequently, and ensure that the ink will not be dried off too much during the ink jet printing process, so as to improve the stability of the ink jet printing process.

Specifically, the high-boiling alcohol compound may be a triethylene glycol.

Step S2, adding a viscosity modifier and a surface tension modifier into the polyelectrolyte solution under stirring effect, and obtaining the ink-jet printing ink of the electron transport layer after being stirred evenly.

Specifically, the surface tension modifier comprises one or more of a cosolvent, a surfactant, and a small molecule compound that regulates a surface tension, the small molecule compound for regulating surface tension comprises one or more of an imidazole and its derivatives, a phenol and a hydroquinone.

Specifically, the viscosity modifier includes one or more of an alcohol, an ether, an ester, a phenol, and an amine.

Specifically, the surface tension modifier and a viscosity modifier are respectively used to regulate the surface tension and the viscosity of the ink-jet printing ink of the electron transport layer to meet the requirements of ink-jet printing.

Specifically, the viscosity of the ink-jet printing ink of the electron transport layer is 1 cps~10 cps.

Specifically, the surface tension of the ink-jet printing ink of the electron transport layer is 30 dyne/cm~40 dyne/cm.

Specifically, in the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; a mass percentage of the viscosity modifier is 0.1%~5%. Preferably, a mass percentage of the solvent is 60%~99.7%.

In the OLED device, the electron transport layer is provided between a light emitting layer and the cathode, and usually the solvent of an ink-jet printing material of the light-emitting layer is organic solvents such as a toluene, a chloroform and a chlorobenzene. The ionic conjugated polyelectrolyte has a solubility property of the alcohol and can not be dissolved in organic solvents such as the toluene, the chloroform and the chlorobenzene, while the light-emitting layer material is usually not dissolved in alcoholic solvents. Therefore, the electron transport layer and the light-emitting layer prepared by using the ink-jet printing ink of the electron transport layer of the disclosure do not produce the mutually soluble phenomenon. The cathode is usually the metal material and is prepared by the evaporation method. Therefore, between the electron transport layer prepared by the ink-jet printing ink of the electron transport layer and the cathode will not occur mutually soluble phenomenon.

The disclosure of the ink-jet printing of the electron transport layer adopts the ionic conjugated polyelectrolyte as the solute and the alcohol compounds as the solvent. By adjusting the proportion of each component, viscosity and surface tension to obtain an ink-jet printing technology, suitable for the ink-jet printing ink of the electron transport layer, meets the ink-jet printing process requirements and achieves the method of the ink-jet printing of the electron transport layer. Simultaneously, it avoids a mutually soluble phenomenon occurred between the electron transport layer and the adjacent structural layers during the preparation of the OLED, which is favorable for the production of a full-solution OLED device. According to the above method, the present invention satisfies the manufacturing requirements of the ink-jet printing and realizes the ink-jet printing type of the electron transport layer, which is favorable for the production of a full-solution OLED device.

Base on the method of the ink-jet printing of the electron transport layer above, the disclosure further provides one kind of the ink-jet printing of the electron transport layer, comprising: the solvent and the ionic conjugated polyelectrolyte dispersed in the solvent, the viscosity modifier and the surface tension modifier.

Specifically, the ionic conjugated polyelectrolyte may be the cationic conjugated polyelectrolyte or the anionic conjugated polyelectrolyte, preferably the cationic conjugated polyelectrolyte.

Preferably, the cationic conjugated polyelectrolyte is a carboxyl-substituted cationic conjugated polyelectrolyte.

Preferably, the metal cation in the cationic conjugated polyelectrolyte is the sodium ion ($Na^+$).

Specifically, the solvent comprises the alcohol compound or the mixture of a plurality of the alcohol compounds, the alcohol compound is the monohydric alcohol or the polyhydric alcohol.

Specifically, the solvent comprises at least one high-boiling alcohol compound having the boiling point greater than 200° C. The high-boiling alcohol compound is beneficial to improve the boiling point of the ink jet printing ink obtained subsequently, and ensure that the ink will not be dried off too much during the ink jet printing process, so as to improve the stability of the ink jet printing process.

Specifically, the high-boiling alcohol compound may be the triethylene glycol.

Specifically, the surface tension modifier includes one or more of the cosolvent, the surfactant, and the small molecule compound that regulates surface tension, the small molecule compound for regulating surface tension comprises one or more of the imidazole and its derivatives, the phenol and the hydroquinone.

Specifically, the viscosity modifier includes one or more of the alcohol, the ether, the ester, the phenol, and the amine.

Specifically, the surface tension modifier and the viscosity modifier are respectively used to regulate the surface tension and the viscosity of the ink-jet printing ink of the electron transport layer to meet the requirements of ink-jet printing.

Specifically, the viscosity of the ink-jet printing ink of the electron transport layer is 1 cps~10 cps.

Specifically, the surface tension of the ink-jet printing ink of the electron transport layer is 30 dyne/cm~40 dyne/cm.

Specifically, in the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; a mass percentage of the viscosity modifier is 0.1%~5%. Preferably, a mass percentage of the solvent is 60%~99.7%.

The disclosure of the ink-jet printing of the electron transport layer adopts the ionic conjugated polyelectrolyte as the solute and the alcohol compounds as the solvent. By adjusting the proportion of each component, viscosity and surface tension to obtain an ink-jet printing technology, suitable for the ink-jet printing ink of the electron transport layer, meets the ink-jet printing process requirements and achieves the method of the ink-jet printing of the electron transport layer. Simultaneously, it avoids a mutually soluble phenomenon occurred between the electron transport layer and the adjacent structural layers during the preparation of the OLED, which is favorable for the production of a full-solution OLED device. According to the above method, the present invention satisfies the manufacturing requirements of the ink-jet printing and realizes the ink-jet printing type of the electron transport layer, which is favorable for the production of a full-solution OLED device.

In summary, the ink-jet printing of the electron transport layer and its method are provided. The disclosure of the ink-jet printing of the electron transport layer adopts the ionic conjugated polyelectrolyte as the solute and the alcohol compounds as the solvent. By adjusting the proportion of each component, viscosity and surface tension to obtain an ink-jet printing technology, suitable for the ink-jet printing ink of the electron transport layer, meets the ink-jet printing process requirements and achieves the method of the ink-jet printing of the electron transport layer. Simultaneously, it avoids a mutually soluble phenomenon occurred between the electron transport layer and the adjacent structural layers during the preparation of the OLED, which is favorable for the production of a full-solution OLED device. According to the above method, the disclosure satisfies the manufacturing requirements of the ink-jet printing and realizes the ink-jet printing type of the electron transport layer, which is favorable for the production of a full-solution OLED device.

In the foregoing, for the person generally skilled in the art of the disclosure, other various corresponding changes and modifications can be made according to the disclosure of the technical solutions and technical ideas, while all of these changes and modifications fall within the protection scope of the claims of the disclosure.

What is claimed is:

1. A method for preparing an ink-jet printing ink of an electron transport layer, comprising the following steps:

step S1, providing an ionic conjugated polyelectrolyte and a solvent, dispersing the ionic conjugated polyelectrolyte in the solvent to obtain a polyelectrolyte solution; and step S2, adding a viscosity modifier and a surface tension modifier into the polyelectrolyte solution under stirring effect, and obtaining the ink-jet printing ink of the electron transport layer after being stirred evenly;

wherein the solvent comprises at least one high boiling alcohol compound with a boiling point greater than 200° C.

2. The method for preparing the ink-jet printing ink of an electron transport layer according to claim 1, wherein the ionic conjugated polyelectrolyte is a cationic conjugated polyelectrolyte, the solvent comprises an alcohol compound or a mixture of a plurality of alcohol compounds, and the alcohol compound is a monohydric alcohol or a polyhydric alcohol.

3. The method for preparing the ink-jet printing ink of an electron transport layer according to claim 2, wherein the cationic conjugated polyelectrolyte is a carboxyl-substituted cationic conjugated polyelectrolyte, and a metal cation in the cationic conjugated polyelectrolyte is a sodium ion.

4. The method for preparing the ink-jet printing ink of an electron transport layer according to claim 1, wherein the surface tension modifier comprises one or more of a cosolvent, a surfactant, and a small molecule compound that regulates surface tension, wherein the small molecular molecule compound for regulating surface tension comprises one or more of an imidazole and its derivatives, a phenol and a hydroquinone; and the viscosity modifier comprises one or more of an alcohol, an ether, an ester, a phenol, and an amine.

5. The method for preparing the ink-jet printing ink of an electron transport layer according to claim 1, wherein, in the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; and a mass percentage of the viscosity modifier is 0.1%~5%; and under a condition of temperature less than the boiling point, a viscosity of the ink-jet printing ink of the electron transport layer is 1 cps~10 cps, and a surface tension of the ink-jet printing ink of the electron transport layer is 30 dyne/cm~40 dyne/cm.

6. An ink-jet printing ink of an electron transport layer comprising a solvent and an ionic conjugated polyelectrolyte, and a viscosity modifier and a surface tension modifier dispersed in the solvent; wherein the solvent comprises at least one high boiling alcohol compound with a boiling point greater than 200° C.

7. The ink-jet printing ink of an electron transport layer according to claim 6, wherein the ionic conjugated polyelectrolyte is a cationic conjugated polyelectrolyte, the solvent comprises an alcohol compound or a mixture of a plurality of alcohol compounds, and the alcohol compound is a monohydric alcohol or a polyhydric alcohol.

8. The ink-jet printing ink of an electron transport layer according to claim 7, wherein the cationic conjugated polyelectrolyte is a carboxyl-substituted cationic conjugated polyelectrolyte, and a metal cation in the cationic conjugated polyelectrolyte is a sodium ion.

9. The ink-jet printing ink of an electron transport layer according to claim 6, wherein the surface tension modifier comprises one or more of a cosolvent, a surfactant, and a small molecule compound that regulates surface tension, wherein the small molecule compound for regulating surface tension comprises one or more of an imidazole and its derivatives, a phenol and a hydroquinone; and the viscosity modifier comprises one or more of an alcohol, an ether, an ester, a phenol, and an amine.

10. The ink-jet printing ink of an electron transport layer according to claim 6, wherein, in the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; and a mass percentage of the viscosity modifier is 0.1%~5%; and under a condition of temperature less than the boiling point, a viscosity of the ink-jet printing ink of the electron transport layer is 1 cps~10 cps, and a surface tension of the ink-jet printing ink of the electron transport layer is 30 dyne/cm~40 dyne/cm.

11. A method for preparing an ink-jet printing ink of an electron transport layer, comprising the following steps:

step S1, providing an ionic conjugated polyelectrolyte and a solvent, dispersing the ionic conjugated polyelectrolyte in the solvent to obtain a polyelectrolyte solution; and step S2, adding a viscosity modifier and a surface tension modifier into the polyelectrolyte solution under stirring effect, and obtaining the ink-jet printing ink of the electron transport layer after being stirred evenly;

wherein the ionic conjugated polyelectrolyte is a cationic conjugated polyelectrolyte, the solvent includes an alcohol compound or a mixture of a plurality of alcohol compounds, and the alcohol compound is a monohydric alcohol or a polyhydric alcohol;

wherein the cationic conjugated polyelectrolyte is a carboxyl-substituted cationic conjugated polyelectrolyte, a metal cation in the cationic conjugated polyelectrolyte is a sodium ion; and the solvent comprises at least one high boiling alcohol compound with a boiling point greater than 200° C.;

wherein the surface tension modifier comprises one or more of a cosolvent, a surfactant, and a small molecule compound that regulates surface tension, the small molecule compound for regulating surface tension comprises one or more of an imidazole and its derivatives, a phenol and a hydroquinone; and the viscosity modifier comprises one or more of an alcohol, an ether, an ester, a phenol, and an amine;

wherein, in the ink-jet printing ink of the electron transport layer, a mass percentage of the ionic conjugated polyelectrolyte is 0.1%~30%; a mass percentage of the solvent is 10%~99.99%; a mass percentage of the surface tension modifier is 0.1%~5%; and a mass percentage of the viscosity modifier is 0.1%~5%; and wherein under a condition of temperature less than the boiling point, a viscosity of the ink-jet printing ink of the electron transport layer is 1 cps~10 cps, and a surface tension of the ink-jet printing ink of the electron transport layer is 30 dyne/cm~40 dyne/cm.

* * * * *